(12) United States Patent
Fang et al.

(10) Patent No.: US 6,326,293 B1
(45) Date of Patent: Dec. 4, 2001

(54) FORMATION OF RECESSED POLYSILICON PLUGS USING CHEMICAL-MECHANICAL-POLISHING (CMP) AND SELECTIVE OXIDATION

(75) Inventors: Sung-Jen Fang, Richardson; Mark R. Visokay, Rowlett; Rajesh B. Khamankar, Irving, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/216,232

(22) Filed: Dec. 18, 1998

Related U.S. Application Data
(60) Provisional application No. 60/070,635, filed on Jan. 7, 1998, and provisional application No. 60/068,342, filed on Dec. 19, 1997.

(51) Int. Cl.$^7$ .................................................. H01L 21/44
(52) U.S. Cl. .................. 438/597; 438/597; 438/598; 438/618; 438/626; 438/629; 438/630; 438/631; 438/632; 438/635; 438/637; 438/638; 438/639; 438/640; 257/752
(58) Field of Search .................................... 438/597, 598, 438/618, 626–640; 257/752

(56) References Cited

U.S. PATENT DOCUMENTS

| | | | |
|---|---|---|---|
| 4,604,150 | * 8/1986 | Lin | 148/188 |
| 5,084,407 | * 1/1992 | Boland et al. | 437/61 |
| 5,148,247 | * 9/1992 | Miura et al. | 357/23.6 |
| 5,196,373 | * 3/1993 | Beasom | 437/203 |
| 5,316,978 | * 5/1994 | Boyd et al. | 437/203 |
| 5,455,194 | * 10/1995 | Vasquez et al. | 437/67 |
| 5,534,460 | * 7/1996 | Tseng et al. | 437/187 |
| 5,587,338 | * 12/1996 | Tseng | 437/186 |
| 5,595,928 | * 1/1997 | Lu et al. | 437/52 |
| 5,604,159 | * 2/1997 | Cooper et al. | 437/203 |
| 5,830,792 | * 11/1998 | Tseng | 438/254 |
| 5,882,976 | * 3/1999 | Blair | 438/309 |
| 5,926,717 | * 7/1999 | Michael et al. | 438/387 |
| 5,933,748 | * 8/1999 | Chou et al. | 438/431 |
| 6,118,167 | * 9/2000 | DiSimone et al. | 257/510 |
| 6,169,006 | * 1/2001 | Gardner et al. | 438/303 |

* cited by examiner

Primary Examiner—Matthew Smith
Assistant Examiner—G. Lee
(74) Attorney, Agent, or Firm—Jacqueline J. Garner; Wade James Brady, III; Frederick J. Telecky, Jr.

(57) ABSTRACT

A plug is formed of polysilicon, or other oxidizable conductor. Chemical-mechanical polishing is performed, with a polish stop layer defining the top of the dielectric layer. The upper portion of the polysilicon is oxidized to a controlled depth, then the oxidized portion is removed by an etch, followed by removal of the polish stop layer. The plug thus formed protrudes a controllable distance above the surrounding dielectric, providing good contact to subsequent conductive layers.

11 Claims, 2 Drawing Sheets

FORMATION OF RECESSED POLYSILICON PLUGS USING CHEMICAL-MECHANICAL-POLISHING (CMP) AND SELECTIVE OXIDATION

This application claims priority under 35 USC § 119 (e) (1) of provisional application No. 60/070,635, filed Jan. 7, 1998 and provisional application No. 60/068,342, filed Dec. 19, 1997

BACKGROUND AND SUMMARY OF THE INVENTION

The present invention relates to integrated circuit structures and fabrication methods, and specifically to the formation of conductive plugs for interconnects.

Background: Contact and Via Hole Filling

As integrated circuits are scaled to smaller submicron dimensions, the geometries of contact and via holes become more difficult to work with. The vertical spacings of the layers do not shrink as fast as the horizontal dimensions, so the aspect ratio (height to width ratio) of contact and via holes is continually increasing. Secondly, as the width of contact holes becomes smaller, the ratio of sidewall surface area to hole volume becomes larger.

Background: Plug Processes

One of the standard tools for contact and via metallization is a plug process. In such processes, a conductive material is used to substantially fill the contact hole before the overlying conductor layer is deposited in the pattern. Even if the contact or via hole is only filled partway, the ability to partially fill the volume of the hole greatly eases the requirements on the following metallization step. Thus a material, such as tungsten or polysilicon, which has a very good conformal deposition process can be used for the conductive plugs, and the overlying metallization layer can be a material (such as aluminum or an aluminum alloy) which is selected for other reasons.

Traditionally, recessed polysilicon plugs were fabricated using reactive ion etch (RIE). However, step height uniformity of the recessed structures fabricated by RIE is relatively poor. The process flow using traditional RIE is shown in FIGS. 3A and 3B. First, polysilicon 30 is deposited on top of the dielectric 10 to fill holes (FIG. 3A). In general, the as-deposited polysilicon surface is not planar. Next, a recessed structure is formed when the necessary overetch (required to ensure that all polysilicon is removed from the dielectric surface) removes some polysilicon from the hole (FIG. 3B). The minimum step height of the recessed structure is limited by the step height of the as-deposited surface, the difference of etch rates between the dielectric and polysilicon, and the total etch time. In general, this process gives high non-uniformity within a wafer.

Formation of Conductive Plugs with Precisely Controllable Protrusion Above Contact Holes The present invention provides a new method for fabrication of recessed plugs in contact or via holes. Before the contact or via holes are patterned, an oxidation-resistant material is deposited over the dielectric. This layer is patterned and etched, together with the interlevel dielectric, to define the contact holes. Thereafter, a conductor is deposited into the contact or via hole, the conductor being of an oxidizable material (at least in its upper portion). In the presently preferred embodiment, the oxidizable material is polysilicon. Thereafter, a selective CMP process is performed, which polishes away any excess of the plug material above the top of the oxidation mask material, but which is highly selective to the oxidation mask material. Thus, the oxidation mask material is not eroded when the polishing operation is performed. This is followed by a controlled oxidation step, to oxidize the conductor to a controlled distance below the top of the oxidation mask. An etching process is performed to remove the oxidized conductor material, very selectively with respect to the oxidation mask material and the unoxidized conductor material. This process forms a recessed conductive plug with a very controllable step height, in contrast to the previous methods employed.

Advantages of the disclosed methods and structures include:

improves step height uniformity across wafer and within lot;

better process control because step height is only determined by the thickness of thermally oxidized polysilicon;

uses currently available processes;

lower cost of ownership due to higher throughput and lack of RIE.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

First Process Embodiment: Polysilicon Plugs/Nitride Etch Stop

Figure 1:
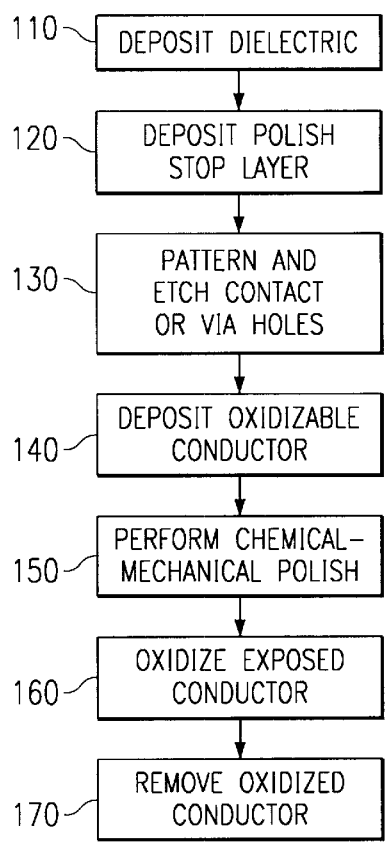
FIG. 1 shows a flowchart of the disclosed method.
Figure 2A:
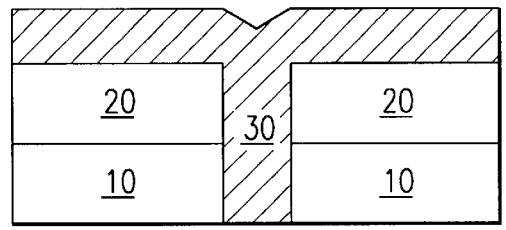
FIGS. 2A–2C show various steps in the disclosed process.

The presently preferred embodiment of the disclosed method is shown in FIG. 1, which will now be discussed with reference to FIGS. 2A–2C. In this embodiment, as seen in FIG. 2A, a dielectric layer 10 of $SiO_2$ is formed (step 110) over active devices (not shown). This will typically be deposited from TEOS in a low-pressure chemical vapor deposition (LPCVD) or plasma enhanced (PE) process, or phosphosilicate glass (PSG). This is followed by deposition (step 120) of a layer of silicon nitride 20, approximately 50 nm thick, which will serve as both a polish stop and as an oxidation barrier. At this point, contact holes are patterned and etched (step 130) through the nitride and dielectric layers. This is followed by deposition (step 140) of a 500 nm layer of polysilicon 30.

Figure 2B:
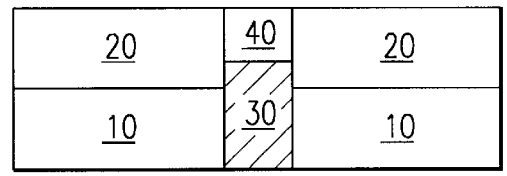
Figure 2C:
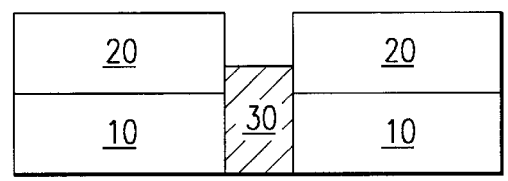

As seen in FIG. 2B, the surface of the polysilicon layer 30 is planarized by chemical-mechanical polishing (CMP) (step 150). Since the polysilicon:nitride selectivity in CMP is very high (100–1000), the total removal of silicon nitride during planarization is minimal. This implies that there is no "dishing" effect in the $Si_3N_4$ field areas.

Figure 2D:
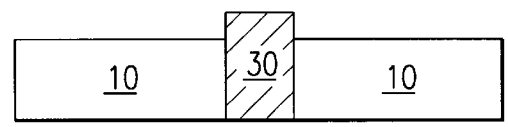
Figure 3A:
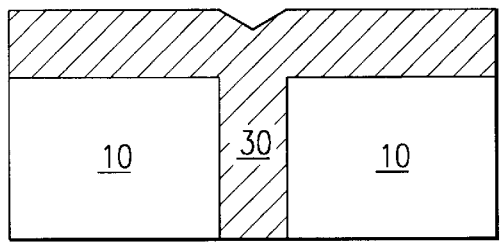
FIGS. 3A–3B show a previous method of forming polysilicon plugs.
Figure 3B:
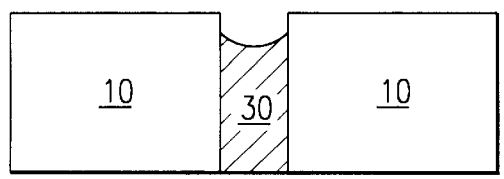

The polysilicon is then thermally oxidized (step 160), with the nitride layer serving as an oxidation barrier. This oxidation will be stopped above the level of the dielectric, and within the layer of nitride, forming region 40 of oxide. Finally, the oxidized polysilicon 40 is etched (step 170), by either a wet or dry etch, to remove the oxidized polysilicon. In this embodiment, dilute HF solution is used to remove the oxidized polysilicon, forming the structure shown in FIG. 2C. The step height of this recessed structure is ONLY determined by the thickness of oxidized polysilicon. In practice, the thickness of the oxidized polysilicon is extremely uniform across a wafer. Thus, step heights of various plugs across a wafer are almost identical, and since the oxidation is stopped within the nitride layer, there is no chance of etching the underlying oxide. Finally, the nitride layer is removed, using a conventional process (step 180), so that the top surface of the silicon plug stands just above the level of the $SiO_2$ dielectric 10, as shown in FIG. 2D.

Figure 4A:
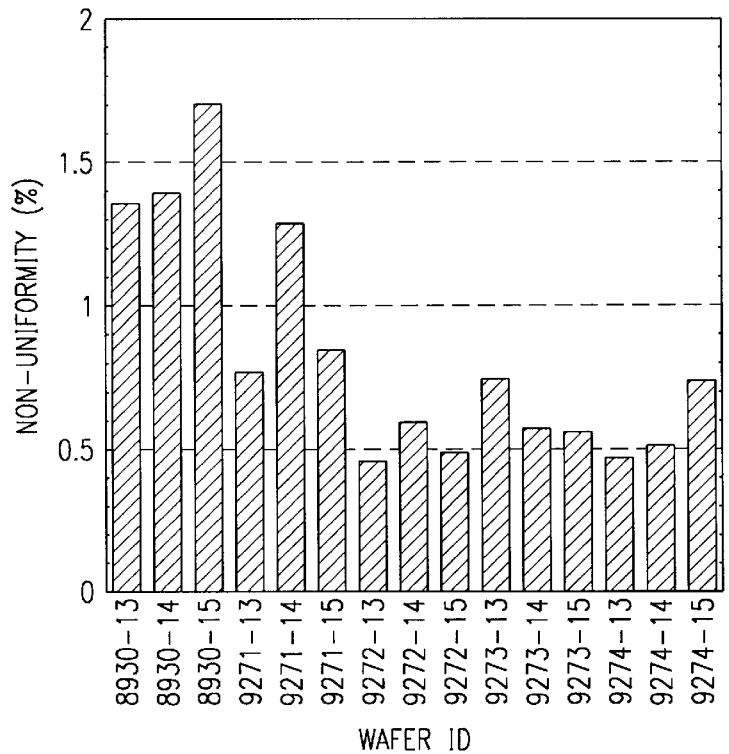
FIGS. 4A–4B show the comparative non-uniformity of post-CMP surfaces with an oxide polish stop layer and with a nitride polish stop layer.
Figure 4B:
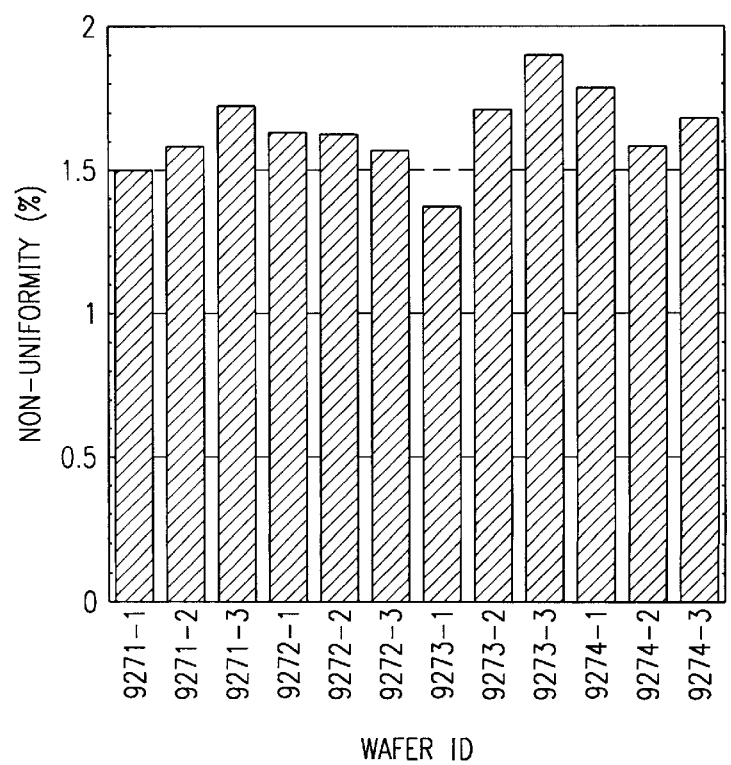

FIG. 4A shows the non-uniformity of post-CMP surfaces with an oxide polish stop layer, while FIG. 4B shows the same for a nitride polish stop layer. While the non-uniformity of the oxide layer is in the range of 24–33 nm, the non-uniformity of the nitride layer after CMP is in the range of 0.7–2.2 nm.

Second Embodiment: Amorphous Silicon Deposition

In an alternate embodiment, the deposited silicon is amorphous silicon, which can be converted to polysilicon in the same step used to oxidize the upper portion of the plug. Other process parameters remain the same.

Alternate CMP Stop Layer

In an alternative embodiment, it is contemplated that other materials can be used for the polish stop. In such an embodiment, the stop layer should also be able to serve as an oxidation or reaction mask. For example, such materials as titanium dioxide or alumina are contemplated.

Plug Over Plug

In another class of alternative embodiments, it is contemplated that the conductive plug material may be deposited on top of a different plug material. Thus, for example, polysilicon plugs may be formed, to a precise height as described above, above plugs made of tungsten and titanium nitride.

According to a disclosed class of innovative embodiments, there is provided: An integrated circuit structure, comprising a dielectric layer overlying a semiconductor material in which electrically active areas are present, the dielectric having a plurality of holes therethrough; conductive silicon plugs filling ones of the plurality of holes, the silicon plugs having a substantially planar surface which extends a desired distance beyond the surface of the dielectric which is farthest from the semiconductor material.

According to another disclosed class of innovative embodiments, there is provided: A fabrication method for an integrated circuit interconnect, comprising the steps of: (a.) forming an oxidizable conductive layer which overlies a dielectric material and fills holes in said dielectric material; (b.) performing chemical-mechanical polishing on said oxidizable conductive layer, wherein said chemical-mechanical polishing substantially does not remove any of said dielectric material; (c.) oxidizing the surface of said oxidizable conductive layer which is exposed in said holes; (d.) removing the oxidized portion of said oxidizable conductive layer; wherein said oxidizable conductive layer provides a conductive plug with a controllable step height in relation to said dielectric layer.

According to another disclosed class of innovative embodiments, there is provided: A fabrication method for an integrated circuit interconnect, comprising the steps of: (a.) depositing a layer of a dielectric over a partially fabricated integrated circuit; (b.) depositing a layer of an oxidation-resistant material over said dielectric; (c.) patterning and etching holes through said oxidation-resistant material and said dielectric to expose a conductive structure; (e.) forming an oxidizable conductive layer which overlies said oxidation-resistant material and fills said holes; (e.) polishing said oxidizable conductive layer, said oxidation-resistant material providing a polish stop layer for said polishing; (f.) oxidizing the exposed surface of said oxidizable conductive layer to a controlled depth; (g.) removing the oxidized portion of said oxidizable conductive layer; whereby said oxidizable conductive layer provides a conductive plug with a controllable step height in relation to said dielectric layer.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Similarly, while the contact from first metal to poly and active has been particularly described, it will be readily recognized that the disclosed inventions are also applicable to processes with multiple layers of interconnection.

In an alternate embodiment, the plugs can be formed of polycrystalline SiGe.

In a further alternate embodiment, another process which is functionally similar to oxidation can be used to reduce the height of the plug.

In a further alternate embodiment, the etch stop layer can be removed after removal of the oxidized polysilicon, so that the plug stands a predetermined height above the surrounding surface.

What is claimed is:

1. A fabrication method for controlling step height in vias in an integrated circuit interconnect system, comprising the steps of:

depositing a layer of a dielectric over a conductive structure of a partially fabricated integrated circuit;

depositing a layer of an oxidation-resistant material over said dielectric;

patterning and etching vias through said oxidation-resistant material and said dielectric to expose said conductive structure;

forming an oxidizable conductive layer which overlies said oxidation-resistant material and fills said vias;

removing the portion of said oxidizable conductive layer which overlies said oxidation-resistant material;

oxidizing the exposed surface of said oxidizable conductive layer to a controlled depth which stops above the dielectric and along said oxidation-resistant material;

removing the oxidized portion of said oxidizable conductive layer, the exposed surface of said unoxidized portion of said oxidizable conductive layer extending above said dielectric and along said oxidation-resistant material;

said oxidizable conductive layer providing a conductive plug with a controllable step height in relation to said dielectric layer.

2. The method of claim 1, wherein said oxidizable conductive layer comprises polysilicon.

3. The method of claim 1, wherein said oxidation-resistant layer comprises silicon nitride.

4. A partially fabricated integrated circuit structure, comprising:

an electrically conductive structure;

a dielectric layer overlying said electrically conductive structure, said dielectric having a via therethrough extending to said electrically conductive structure and having an exposed upper surface;

an oxidation-resistant layer disposed over said dielectric layer and having a via therethrough aligned with said via extending through said dielectric layer; and an electrically conductive silicon plug filling said via extending through said dielectric layer and extending to said electrically conductive structure, said plug partially filling said via extending through said oxidation-resistant layer, said silicon plug having a substantially planar top surface and having substantially the cross section of the associated via.

5. The integrated circuit structure of claim 4, wherein said dielectric layer comprises an oxide.

6. A fabrication method for an integrated circuit interconnect, comprising the steps of:

providing a layer of electrically conductive material;

providing a dielectric material over said layer of electrically conductive material having an oxidation-resistant barrier region thereon;

forming a via extending through said dielectric material and oxidation-resistant barrier and extending to said layer of electrically conductive material;

forming an oxidizable conductive layer which overlies said oxidation-resistant barrier region and fills said via in said dielectric material and in said oxidation-resistant barrier;

performing chemical-mechanical polishing on said oxidizable conductive layer to remove the portion of said oxidizable conductive layer which overlies said oxidation-resistant barrier, wherein said chemical-mechanical polishing essentially does not remove any of said oxidation-resistant barrier region dielectric material and retains said oxidizable conductive layer only in said via;

oxidizing the exposed surface of said oxidizable conductive layer which is now disposed within said via down to a level within said oxidation-resistant barrier region;

removing the oxidized portion of said oxidizable conductive layer; and removing said oxidation-resistant barrier, wherein said oxidizable conductive layer provides a conductive plug with a controllable step height in relation to said dielectric layer.

7. The method of claim 6, wherein said oxidizable conductive layer comprises polysilicon.

8. The method of claim 6, wherein said oxidation barrier region comprises silicon nitride.

9. The method of claim 6 wherein said oxidation barrier region is also a polish layer stop.

10. The method of claim 7 wherein said oxidation barrier region is also a polish layer stop.

11. The method of claim 8 wherein said oxidation barrier region is also a polish layer stop.

* * * * *